(12) United States Patent
Lim et al.

(10) Patent No.: US 10,580,488 B2
(45) Date of Patent: Mar. 3, 2020

(54) MEMORY DEVICE FOR GENERATING A COMPENSATION CURRENT BASED ON A DIFFERENCE BETWEEN A FIRST READ VOLTAGE AND A SECOND READ VOLTAGE AND A METHOD OF OPERATING THE SAME

(71) Applicant: SAMSUNG ELECTRONICS CO., LTD., Suwon-si, Gyeonggi-do (KR)

(72) Inventors: Chea Ouk Lim, Hwaseong-si (KR); Tae Hui Na, Seoul (KR); Jung Sunwoo, Seoul (KR); Yong Jun Lee, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/034,850

(22) Filed: Jul. 13, 2018

(65) Prior Publication Data

US 2019/0172531 A1 Jun. 6, 2019

(30) Foreign Application Priority Data

Dec. 5, 2017 (KR) .......................... 10-2017-0165843

(51) Int. Cl.
*G11C 13/00* (2006.01)

(52) U.S. Cl.
CPC ........ *G11C 13/0004* (2013.01); *G11C 13/003* (2013.01); *G11C 13/004* (2013.01); *G11C 13/0033* (2013.01); *G11C 13/0069* (2013.01); *G11C 2013/0047* (2013.01); *G11C 2013/0057* (2013.01); *G11C 2213/15* (2013.01); *G11C 2213/72* (2013.01)

(58) Field of Classification Search
CPC ............. G11C 13/0004; G11C 13/004; G11C 13/0069
See application file for complete search history.

(56) References Cited

U.S. PATENT DOCUMENTS

| | | |
|---|---|---|
| 8,634,225 B2 | 1/2014 | Kang |
| 8,743,600 B2 | 6/2014 | Hokenmaier |
| 9,036,409 B2 | 5/2015 | Gordon et al. |

(Continued)

OTHER PUBLICATIONS

Search Report and Written Opinion issued in corresponding Singapore patent Application No. 10201809021S dated Apr. 9, 2019.

*Primary Examiner* — Ajay Ojha
(74) *Attorney, Agent, or Firm* — F. Chau & Associates, LLC

(57) ABSTRACT

A memory device including: a memory cell array, including a memory cell having a switch element and a data storage element connected to the switch element, wherein the data storage element has a phase change material; and a memory controller for inputting a first read current to the memory cell to detect a first read voltage, inputting a second read current to the memory cell to detect a second read voltage, and inputting a compensation current to the memory cell, wherein the compensation current lowers a resistance value of the data storage element, the compensation current is input when a first state of the memory cell is different from a second state of the memory cell, the first state is determined using the first read voltage and the second state is determined using the second read voltage.

20 Claims, 16 Drawing Sheets

(56) References Cited

U.S. PATENT DOCUMENTS

| | | |
|---|---|---|
| 9,165,683 B2 | 10/2015 | Tam |
| 9,257,175 B2 | 2/2016 | Pangal et al. |
| 9,286,975 B2 | 3/2016 | Chu et al. |
| 9,613,691 B2 | 4/2017 | Mantegazza et al. |
| 9,721,657 B1 * | 8/2017 | Qawami ............ G11C 13/0004 |
| 2004/0022085 A1 | 2/2004 | Parkinson et al. |
| 2008/0117704 A1 | 5/2008 | Happ et al. |
| 2010/0321987 A1 | 12/2010 | Lung et al. |
| 2012/0092923 A1 * | 4/2012 | Bedeschi ............ G11C 11/5678 365/163 |
| 2014/0192588 A1 * | 7/2014 | Lee ...................... G11C 13/004 365/148 |
| 2015/0063004 A1 | 3/2015 | Sutardja et al. |
| 2015/0294716 A1 | 10/2015 | Tortorelli et al. |
| 2016/0372193 A1 | 12/2016 | Kripanidhi et al. |
| 2017/0236580 A1 | 8/2017 | Chu et al. |
| 2018/0158524 A1 * | 6/2018 | Shin .................. G11C 13/0026 |

* cited by examiner

MEMORY DEVICE FOR GENERATING A COMPENSATION CURRENT BASED ON A DIFFERENCE BETWEEN A FIRST READ VOLTAGE AND A SECOND READ VOLTAGE AND A METHOD OF OPERATING THE SAME

CROSS-REFERENCE TO RELATED APPLICATION

This application claims priority under 35 U.S.C. § 119 to Korean Patent Application No. 10-2017-0165843 filed on Dec. 5, 2017 in the Korean Intellectual Property Office, the disclosure of which is incorporated by reference herein in its entirety.

1. Technical Field

The present inventive concept relates to a memory device and a method of operating the same.

2. Description of Related Art

As demand for low power consuming and highly integrated memory devices increases, research into various types of next generation memory devices is being conducted. One example next generation memory device that is being studied may store and delete data by adjusting a resistance applied to a data storage element with phase change characteristics.

SUMMARY

According to an exemplary embodiment of the present inventive concept, a memory device includes: a memory cell array, including a memory cell having a switch element and a data storage element connected to the switch element, wherein the data storage element has a phase change material; and a memory controller for inputting a first read current to the memory cell to detect a first read voltage, inputting a second read current to the memory cell to detect a second read voltage, and inputting a compensation current to the memory cell, wherein the compensation current lowers a resistance value of the data storage element, the compensation current is input when a first state of the memory cell is different from a second state of the memory cell, the first state is determined using the first read voltage and the second state is determined using the second read voltage.

According to an exemplary embodiment of the present inventive concept, a memory device includes: a memory cell array, including a memory cell having a switch element and a data storage element connected to the switch element, wherein the data storage element has a phase change material; and a memory controller for inputting a read current to the memory cell to sequentially detect a first read voltage and a second read voltage, and inputting a compensation current to the memory cell, wherein the compensation current is input when the memory cell is determined to be in a set state based on the first read voltage and the memory cell is determined to be in a reset state based on the second read voltage such that the compensation current puts the memory cell back into the set state after the memory cell is in the reset state.

According to an exemplary embodiment of the present inventive concept, a memory device includes: a memory cell array having a plurality of memory cells in a set state or a reset state; and a memory controller for selecting, from the plurality of memory cells, first memory cells in the set state, selecting, from the first memory cells, second memory cells switched to the reset state, and inputting a compensation current to the second memory cells, wherein the compensation current changes the second memory cells to the set state, while a reading operation on the memory cell array is performed.

According to an exemplary embodiment of the present inventive concept, a method of operating a memory device includes: reading a first read voltage from each of a plurality of memory cells; determining, from the plurality of memory cells, first memory cells in a set state, using the first read voltage; reading a second read voltage from each of the first memory cells; determining, from the first memory cells, second memory cells in a reset state, using the second read voltage; and inputting a set write current to the second memory cells, wherein the set write current puts the second memory cells in a set state.

According to an exemplary embodiment of the present inventive concept, a memory device includes: a memory cell array, including a memory cell having a switch element and a data storage element connected to the switch element, wherein the data storage element has a phase change material; and a memory controller for inputting a first read current to the memory cell to detect a first read voltage, inputting a second read current to the memory cell to detect a second read voltage, and inputting a compensation current to the memory cell to lower a resistance value of the data storage element when a state of the memory cell is changed after the first read current is input to the memory cell.

BRIEF DESCRIPTION OF THE DRAWINGS

The above and other features of the present inventive concept will be more clearly understood by describing in detail exemplary embodiments thereof with reference to the accompanying drawings, in which.

DETAILED DESCRIPTION OF THE EMBODIMENTS

Figure 1:
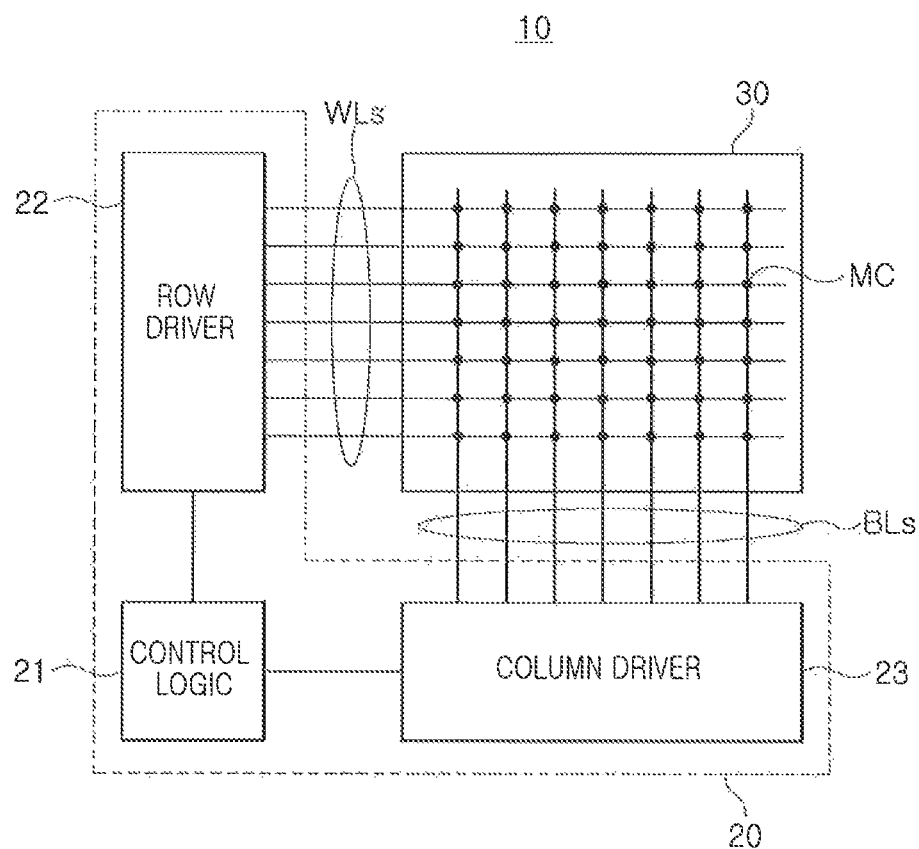
FIG. 1 is a block diagram illustrating a memory device according to an exemplary embodiment of the present inventive concept.

Hereinafter, exemplary embodiments of the present inventive concept will be described with reference to the accompanying drawings. In the drawings, like reference numerals may refer to like elements.

Figure 2:
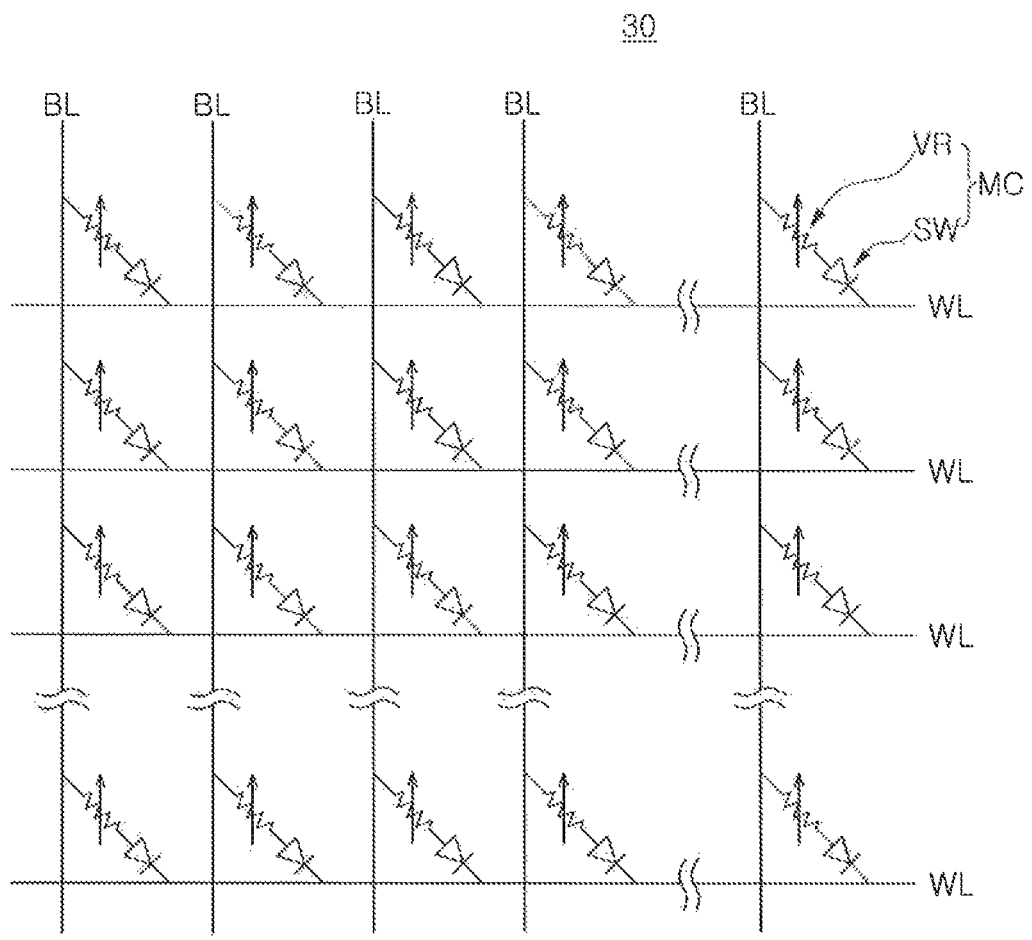
FIG. 2 is a view illustrating a memory cell array included in a memory device according to an exemplary embodiment of the present inventive concept.

FIG. 1 is a block diagram illustrating a memory device according to an exemplary embodiment of the present inventive concept. FIG. 2 is a schematic view illustrating a memory cell array included in a memory device according to an exemplary embodiment of the present inventive concept.

First, referring to FIG. 1, a memory device 10 according to an exemplary embodiment of the present inventive concept may include a memory controller 20 and a memory cell array 30. The memory controller 20 may include a control logic 21, a row driver 22, a column driver 23, and the like. The memory cell array 30 may include a plurality of memory cells MC.

In an exemplary embodiment of the present inventive concept, the row driver 22 may be connected to the memory cells MC through word line WLs, and the column driver 23 may be connected to the memory cells MC through bit line BLs. In an exemplary embodiment of the present inventive concept, the row driver 22 may include an address decoder circuit for selecting a memory cell MC for writing data or reading data. In addition, the column driver 23 may include a read/write circuit for writing data to the memory cell MC, or for reading data from the memory cell MC. Operations of the row driver 22 and the column driver 23 may be controlled by the control logic 21.

Referring to FIG. 2, the memory cell array 30 according to an exemplary embodiment of the present inventive concept may include a plurality of memory cells MC. Each of the memory cells MC may be provided at points at which a plurality of word lines WL and a plurality of bit lines BL intersect with each other. In other words, each of the memory cells MC may be connected to a single word line WL and a single bit line BL.

Each of the memory cells MC may include a switch element SW and a data storage element VR. In an exemplary embodiment of the present inventive concept, the switch element SW may include a PN junction diode, a Schottky diode, or an ovonic threshold switch (OTS). In an exemplary embodiment of the present inventive concept, the data storage element VR may be formed of a phase change material having a chalcogenide material or a superlattice. In other words, the data storage element VR may include a phase change material, which can be phase-changed to an amorphous phase or a crystalline phase, depending on heating time, heating temperature, or the like.

The memory controller 20 may allow a phase change material of the data storage element VR, included in each of the plurality of memory cells MC, to be phase-transitioned to an amorphous phase or a crystalline phase. Thus, the memory controller 20 may write data or erase data in each memory cell MC, through the plurality of word lines WL and the plurality of bit lines BL. In an exemplary embodiment of the present inventive concept, the memory controller 20 may allow a phase change material of the data storage element VR included in the memory cell MC to be phase-transitioned to an amorphous phase. In this case, a resistance of the data storage element VR increases, and data may be written to the memory cell MC. In other words, data may be written to the memory cell MC when its data storage element VR is in the amorphous phase. In addition, the memory controller 20 may allow a phase change material of the data storage element VR included in the memory cell MC to be phase-transitioned to a crystalline phase. In this case, a resistance of the data storage element VR decreases, and data may be erased from the memory cell MC. In other words, data may be erased from the memory cell MC when its data storage element VR is in the crystalline phase.

Figure 3:
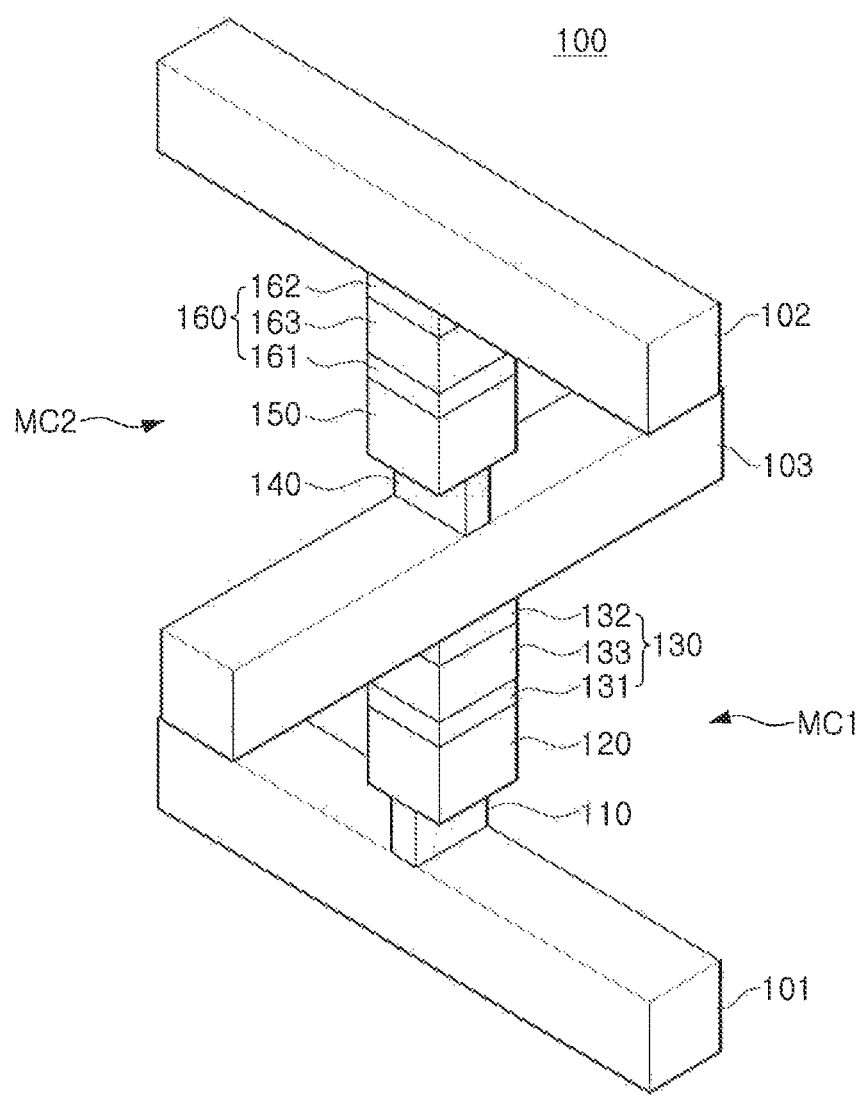
FIG. 3 is a schematic view illustrating a structure of a memory cell included in a memory device according to an exemplary embodiment of the present inventive concept.

FIG. 3 is a schematic view illustrating a structure of a memory cell included in a memory device according to an exemplary embodiment of the present inventive concept.

Referring to FIG. 3, a memory cell 100 included in a memory device according to an exemplary embodiment of the present inventive concept may include a first memory region MC1 provided between a first word line 101 and a bit line 103 as well as a second memory region MC2 provided between a second word line 102 and the bit line 103. Each of the first memory region MC1 and the second memory region MC2 may be operated as an independent memory cell.

The first memory region MC1 may include a first heating electrode 110, a first data storage element 120, a first switch element 130, and the like. The first switch element 130 may include a first switch electrode 131, a second switch electrode 132, a first selective layer 133 disposed therebetween, and the like. In an exemplary embodiment of the present inventive concept, the first selective layer 133 may include an OTS material. When a voltage, higher than a threshold voltage, is applied between the first switch electrode 131 and the second switch electrode 132, a current may flow through the first selective layer 133.

The first data storage element 120 may include a phase change material, for example, a chalcogenide material. For example, the first data storage element 120 may include Ge—Sb—Te (GST). A crystallization temperature, a melting point, a crystallization energy-dependent phase-change rate, and the like of the first data storage element 120 may be determined, according to types and chemical compositions of elements, included in the first data storage element 120.

The second memory region MC2 may have a structure similar to that of the first memory region MC1. Referring to FIG. 3, the second memory region MC2 may include a second heating electrode 140, a second data storage element 150, a second switch element 160, and the like. The second switch element 160 includes a third switch electrode 161, a fourth switch electrode 162, and a second select layer 163 disposed therebetween. Structures and characteristics of each of the second heating electrode 140, the second data storage element 150, and the second switch element 160 may be similar to the first heating electrode 110, the first data storage element 120, and the first switch element 130, respectively. Hereinafter, a method of writing and erasing data will be described with reference to the first memory region MC1, by way of example.

When a voltage is supplied through the first word line 101 and the bit line 103, at an interface between the first heating electrode 110 and the first data storage element 120, Joule heat may be generated. The Joule heat may depend on the level of the supplied voltage. The Joule heat may change the phase change material of the first data storage element 120 from an amorphous phase to a crystalline phase, or from a crystalline phase to the amorphous phase. The first data storage element 120 may have a high resistance in an amorphous phase, and may have a low resistance in a crystalline phase. According to a resistance value of the first data storage element 120, data '0' or '1' may be defined. For example, when the first data storage element 120 in an amorphous phase and has high resistance, data '1' may be stored in the first memory region MC1.

To write data '1' on the first memory region MC1, a reset voltage is supplied through the first word line 101 and the bit line 103. The reset voltage may be higher than a threshold voltage of an OTS material included in the first switch element 130, and thus, a current may flow through the first switch element 130. A phase change material included in the first data storage element 120 may be changed from a crystalline phase to an amorphous phase by the reset voltage, and thus, data '1' may be stored in the first memory region MC1. In an exemplary embodiment of the present inventive concept, the case in which a phase change material included in the first data storage element 120 has an amorphous phase may be referred to as a reset state.

To store data '0' in the first memory region MC1, the phase change material included in the first data storage element 120 may be changed from the amorphous phase to the crystalline phase. For example, a predetermined set voltage may be supplied through the first word line 101 and the bit line 103. A phase change material included in the first data storage element 120 may be changed from an amorphous phase to a crystalline phase by the predetermined set voltage. For example, a maximum value of the predetermined set voltage may be lower than a maximum value of the reset voltage. In addition, the time for which the predetermined set voltage is supplied may be shorter than the time for which the reset voltage is supplied. In an exemplary embodiment of the present inventive concept, the case in which a phase change material included in the first data storage element 120 has a crystalline phase may be referred to as a set state. Moreover, in an exemplary embodiment of the present inventive concept, a resistance value of the first data storage element 120 can be changed. Thus, data, which is represented by two or more bits, may be stored in the first data storage element 120.

As described above, resistance values of the first and second data storage elements 120 and 150 may be changed, depending on states of the phase change materials included in the first and second data storage elements 120 and 150. In addition, a memory controller may identify data stored in memory regions, e.g., the first memory region MC1 and the second memory region MC2, from the resistance values of the first and second data storage elements 120 and 150. Thus, as a difference between the resistance values of the first and second data storage elements 120 and 150 increases due to the changing states of the phase change materials included in the first and second data storage elements 120 and 150, is higher, a memory controller is able to read and write data with more accuracy.

Figure 4A:
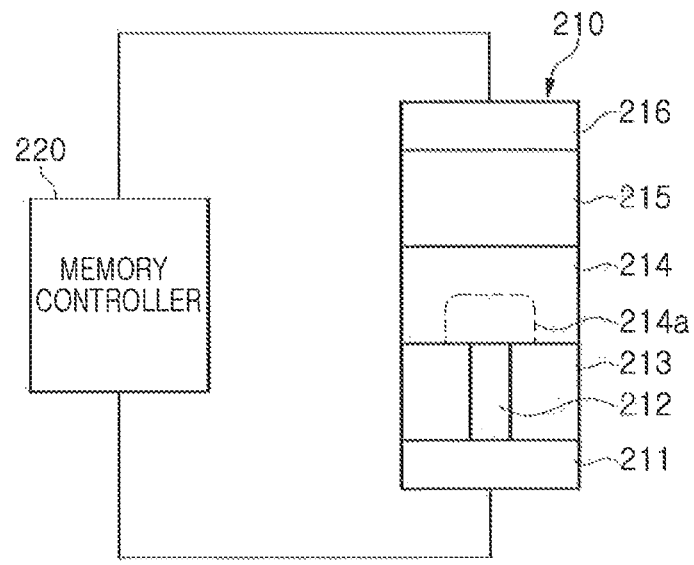
FIGS. 4A, 4B, 5A, and 5B are views provided to illustrate an operation of a memory device according to an exemplary embodiment of the present inventive concept.
Figure 4B:
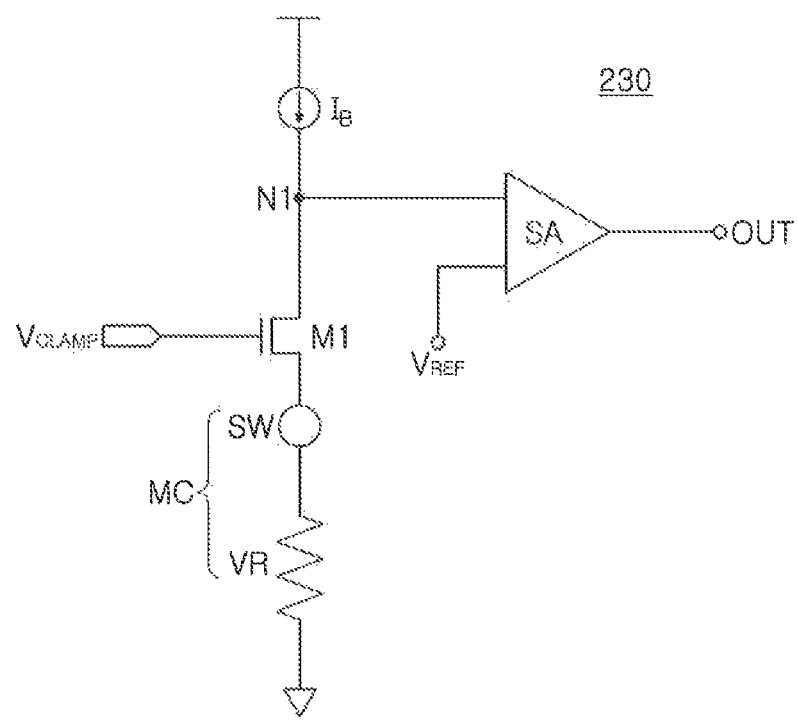

FIGS. 4A and 4B are views provided to illustrate an operation of a memory device according to an exemplary embodiment of the present inventive concept.

A memory device according to an exemplary embodiment of the present inventive concept may be operated by power which a memory controller 220 supplies to a memory cell 210. Referring to FIG. 4, the memory controller 220 may input a current, a voltage, or the like to the memory cell 210, and thus, may store data in the memory cell 210 or may read data stored in the memory cell 210.

The memory cell 210 may include a lower electrode 211, a heating electrode 212, a data storage element 214, a switch element 215, an upper electrode 216, and the like. The lower electrode 211 and the upper electrode 216 may receive a current or a voltage, which the memory cell 210 receives from the memory controller 220, through a word line or a bit line. An insulating layer 213 may be provided around the heating electrode 212, and when a phase change occurs in a portion 214a of the data storage element 214, adjacent to the heating electrode 212, a resistance of the memory cell 210 may be changed. The memory controller 220 may store data in the memory cell 210 by increasing or decreasing the resistance of the memory cell 210, using the phase change that can occur in the data storage element 214.

In an exemplary embodiment of the present inventive concept, the memory controller 220 may supply a predetermined read current to the memory cell 210 to read a resistance value of the memory cell 210. The memory controller 220 may measure a read voltage from the memory cell 210 while the read current is input, and compare the read voltage to a predetermined reference voltage, thereby determining data stored in the memory cell 210.

FIG. 4B illustrates a circuit for reading data stored on a memory cell according to an exemplary embodiment of the present inventive concept.

Referring to FIG. 4B, a memory cell MC may include a switch element SW and a data storage element VR.

A read circuit 230 may supply a level of bias current $I_B$ to the memory cell MC to read data stored in the memory cell MC. In an exemplary embodiment of the present inventive concept, the bias current $I_B$ may be supplied to the memory cell MC through a clamping transistor M1. The clamping transistor M1 may be operated by a clamping voltage $V_{CLAMP}$ input to a gate terminal, and a voltage of a first node N1 may be clamped by the clamping transistor M1 to be within a particular range. The clamping voltage $V_{CLAMP}$ may have ramp voltage characteristics. In an exemplary embodiment of the present inventive concept, the voltage of the first node N1 may be clamped to have a magnitude lower than a threshold voltage of the phase-change material included in the data storage element VR.

In an exemplary embodiment of the present inventive concept, when the clamping voltage $V_{CLAMP}$ is higher than the threshold voltage of the switch element SW, a sense amplifier SA may compare the voltage of the first node N1 and a reference voltage $V_{REF}$ to produce an output signal OUT.

Figure 5A:
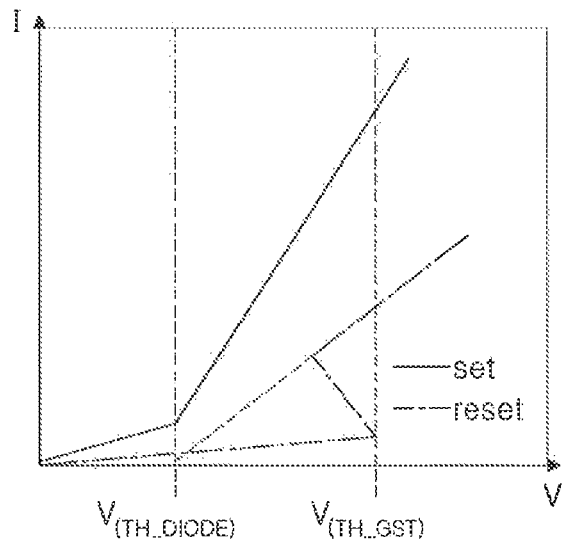
Figure 5B:
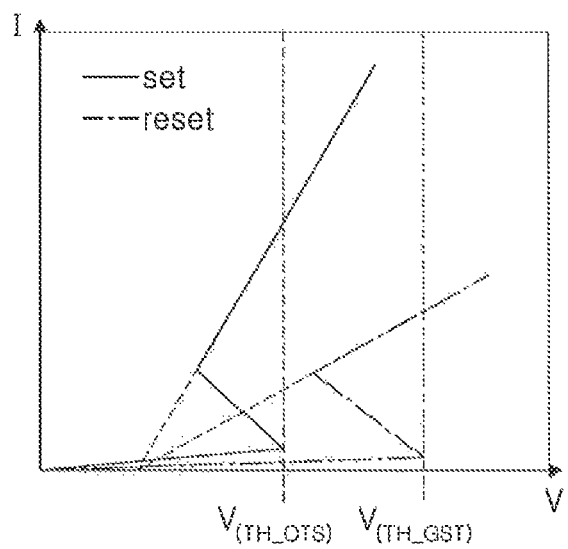

FIGS. 5A and 5B are graphs illustrating current-voltage characteristics of the memory cell MC depending on a state of a data storage element. FIG. 5A illustrates an exemplary embodiment of the present inventive concept in which a switch element included in the memory cell MC is provided as a diode. FIG. 5B illustrates an exemplary embodiment of the present inventive concept in which a switch element included in the memory cell MC is provided as an OTS device. In the exemplary embodiments illustrated with reference to FIGS. 5A and 5B, a set state may correspond to a case in which a data storage element is in a crystalline state, while a reset state may correspond to a case in which the data storage element is in an amorphous state.

First, referring to FIG. 5A, when a memory cell MC including a diode as a switch element has a reset state, and a voltage applied to the memory cell MC is higher than a threshold voltage $V_{TH\_GST}$ of a data storage element, a snapback phenomenon may occur. Still referring to FIG. 5A, when the memory cell MC has a set state, a snapback phenomenon, which is due to an increase in a voltage applied to the memory cell MC, may not occur.

Next, referring to FIG. 5B, when a memory cell MC including an OTS device as a switch element has a reset state, and a voltage applied to the memory cell MC is higher than a threshold voltage $V_{TH\_GST}$ of a data storage element, a snapback phenomenon may occur. As further illustrated in FIG. 5B, when the memory cell MC has a set state, a snapback phenomenon may occur. Referring to FIG. 5B, the snapback phenomenon, which occurs when the memory cell MC has the set state, may occur when a level of the voltage applied to the memory cell MC is higher than a threshold voltage $V_{TH\_OTS}$ of a switch element.

Thus, when a memory cell MC includes a OTS device as a switch element, a snapback phenomenon may occur when data is read from the memory cell MC in a set state. Due to the snapback phenomenon, which occurs in the reading operation, a phase change may occur in a data storage element included in the memory cell MC in a set state, thereby increasing a resistance value of the data storage element. In other words, due to the snapback phenomenon in the reading operation, a resistance value of the memory cell MC in a set state may be increased, and thus, a sensing margin of the memory cell MC may be decreased. Thus, operating characteristics of the memory device may be deteriorated.

Figure 6A:
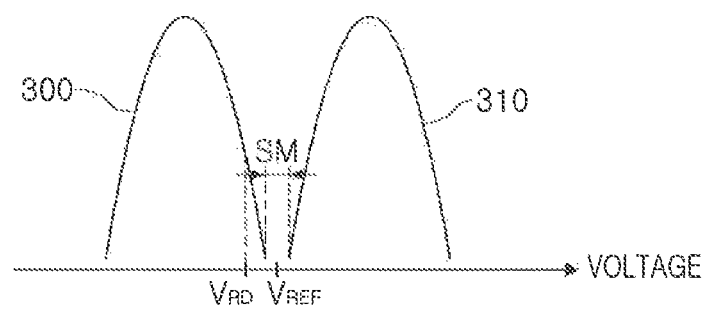
FIGS. 6A and 6B are views provided to illustrate an operation of a memory device according to an exemplary embodiment of the present inventive concept.
Figure 6B:
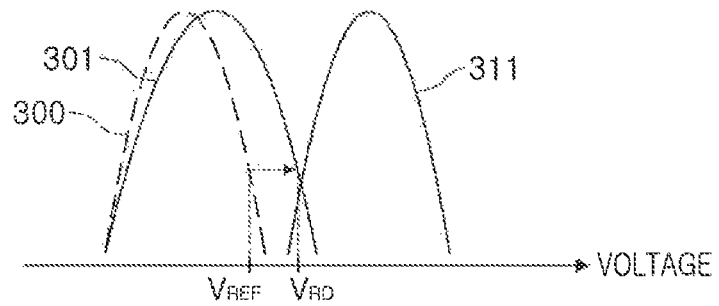

FIGS. 6A and 6B are views provided to illustrate an operation of a memory device according to an exemplary embodiment of the present inventive concept. In accordance with an exemplary embodiment of the present inventive concept, FIGS. 6A and 6B are graphs illustrating a distribution of a read voltage depending on a state of memory cells included in a memory device.

FIGS. 6A and 6B are views provided to illustrate a reading operation of a memory device according to the related art. First, referring to FIG. 6A, a first set read voltage distribution 300 illustrating a read voltage distribution of memory cells in a set state and a reset read voltage distribution 310 illustrating a read voltage distribution of memory cells in a reset state are illustrated. A sensing margin SM may be present between the first set read voltage distribution 300 and the reset read voltage distribution 310, and a reference voltage $V_{REF}$ may be in the sensing margin SM. A read circuit of a memory controller may compare a read voltage read from each of the memory cells to the reference voltage $V_{REF}$, and thus, a state of each of the memory cells may be determined to be in a set state or a reset state.

When a memory controller performs a reading operation on memory cells, a snapback phenomenon may occur in at least a portion of memory cells in a set state, and thus, a resistance of the memory cells in the set state may be increased. As the snapback phenomenon occurs, as illustrated in FIG. 6B, an intermediate value and/or a deviation of the first set read voltage distribution 300 is increased. When this happens, a read voltage of the memory cells in the set state may have a second set read voltage distribution 301.

While a set read voltage distribution is changed from the first set read voltage distribution 300 to the second set read voltage distribution 301, a state of a portion of the memory cells may not be accurately determined either as a set state or as a reset state in a subsequent reading operation. For example, referring to FIGS. 6A and 6B, a read voltage $V_{RD}$ of a specific memory cell may be increased by a snapback phenomenon caused by a reading operation. Therefore, a state of the memory cell may not be accurately determined to be in the set state or as the reset state.

In accordance with an exemplary embodiment of the present inventive concept, a compensation current may be input after a reading operation to at least a portion of the memory cells determined to be in a set state by the reading operation. The compensation current may allow resistance, which had increased in the memory cells of a set state by a snapback phenomenon, to be decreased.

FIGS. 7A, 7B, 8A, 8B, and 8C are views provided to illustrate an operation of a memory device according to an exemplary embodiment of the present inventive concept.

Figure 7A:
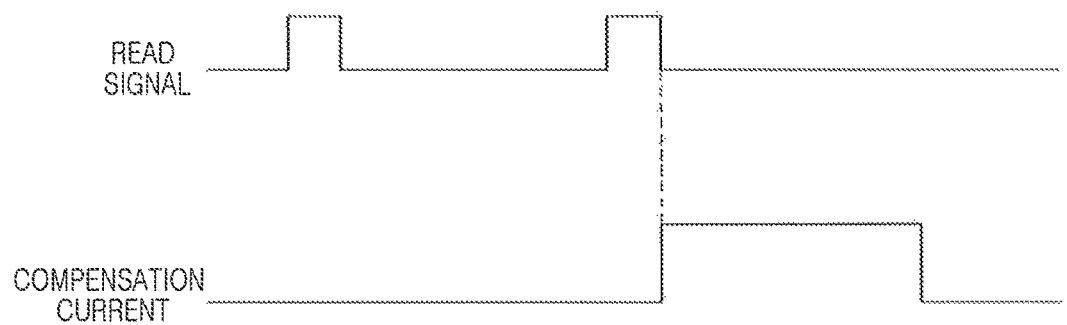
FIGS. 7A, 7B, 8A, 8B, and 8C are views provided to illustrate an operation of a memory device according to an exemplary embodiment of the present inventive concept.
Figure 7B:
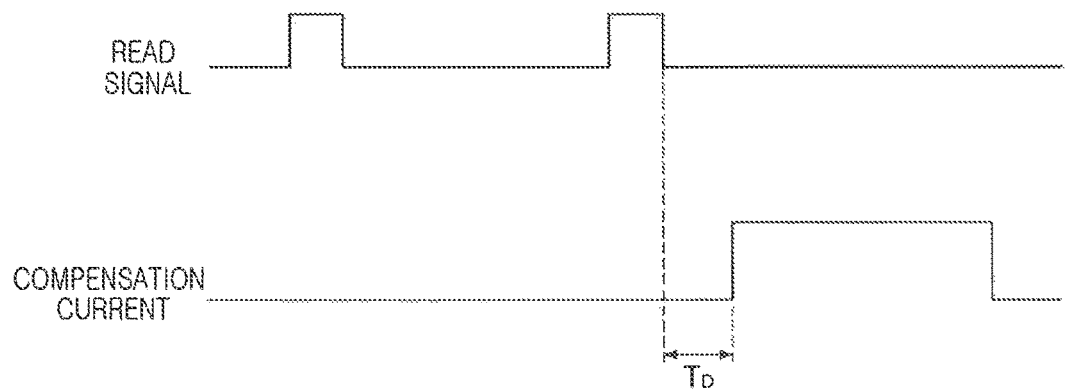

FIGS. 7A and 7B are timing diagrams illustrating a read signal and a compensation current, which a memory controller inputs to memory cells in a reading operation of a memory device, according to an exemplary embodiment of the present inventive concept. First, referring to FIG. 7A, to perform a first reading operation and a second reading operation, a memory controller may input a read signal to memory cells two times in sequence. In an exemplary embodiment of the present inventive concept, a read signal input for a first reading operation and a read signal input for a second reading operation may be the same as or different from each other.

The memory controller may input a compensation current to memory cells immediately after the second reading operation is completed, in other words, immediately after an input of a second read signal is completed. In an exemplary embodiment of the present inventive concept, the compensation current may only be input to a portion of memory cells, among memory cells in a set state, which have been determined to have an increased resistance by a read signal.

In an exemplary embodiment of the present inventive concept, the memory controller may input a first read signal to each of memory cells in which data is to be read, and thus, a state of each of the memory cells may be determined to be in a set state or a reset state. Thereafter, the memory controller may selectively input a second read signal only to the memory cells determined to be in the set state, and thus, a second reading operation may be performed. The memory controller may input a compensation current only to the memory cells determined to be in the reset state in the second reading operation.

In an exemplary embodiment of the present inventive concept, a memory controller inputs a compensation current to memory cells after reading data from memory cells, thereby securing stable operations in a memory device. Moreover, of memory cells determined to be in a set state, a compensation current is selectively input only to a portion of memory cells whose resistance increased due to a reading operation, thereby efficiently managing power consumption of a memory device. In an exemplary embodiment of the present inventive concept, a memory controller may allow a second reading operation to be performed only in memory cells determined to be in a set state in a first reading operation, and may selectively input a compensation current only to memory cells determined to be in a reset state in a second reading operation.

Next, referring to FIG. 7B, a memory controller may input a read signal to memory cells twice, and thus, may allow a first reading operation and a second reading operation to be sequentially performed. Moreover, the memory controller may input a compensation current to memory cells after the second reading operation is completed and a delay time $T_D$ passes. The delay time $T_D$ may be constant. In an exemplary embodiment of the present inventive concept, the delay time $T_D$ may correspond to a read latency of a memory device. In a similar manner to the embodiment illustrated in FIG. 7A, a compensation current may only be input to a portion of memory cells, determined to be in a set state in the first reading operation, and determined to be in a reset state in the second reading operation.

In addition, in the embodiment illustrated in FIG. 7B, a compensation current may be input when data read from memory cells is output. In an exemplary embodiment of the present inventive concept, the time in which data read from memory cells is output may be the time it takes for data read from the memory cells to be written to a page buffer. In the embodiment illustrated in FIG. 7B, an operation of inputting a compensation current after a reading operation and an operation of outputting data read from memory cells are simultaneously processed; therefore, the time required for a reading operation may be efficiently managed.

Figure 8A:
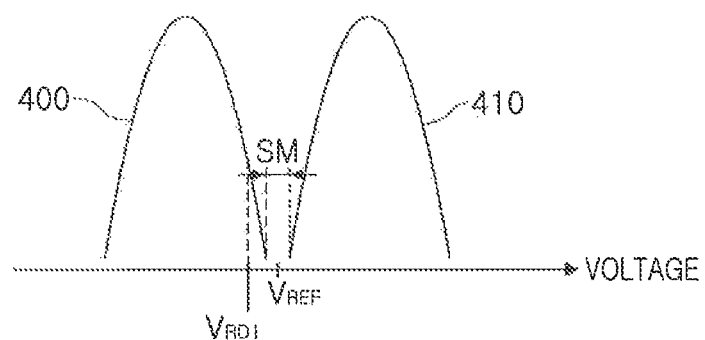
Figure 8B:
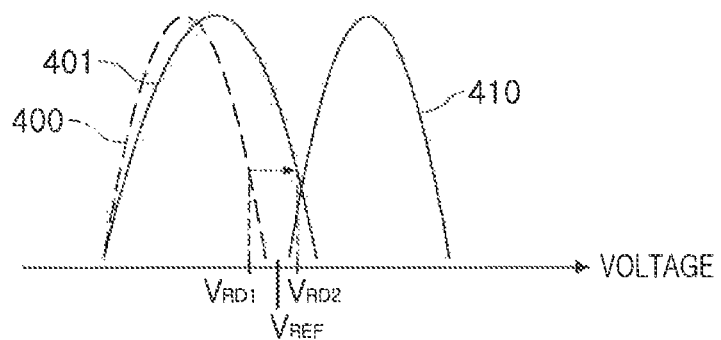
Figure 8C:
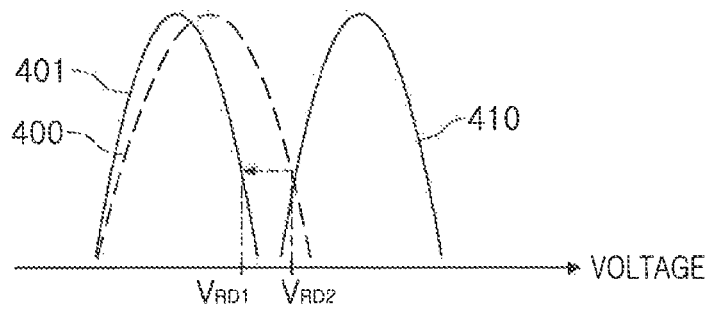

FIGS. 8A, 8B, and 8C are graphs illustrating a distribution of a read voltage depending on a state of memory cells included in a memory device, according to an exemplary embodiment of the present inventive concept. First, FIG. 8A is a graph illustrating a set read voltage distribution 400 and a reset read voltage distribution 410, which memory cells have, before a first reading operation is performed. Referring to FIG. 8A, a memory controller may allow a first reading operation to be performed, and thus, may read a first read voltage $V_{RD1}$ from a memory cell. The first read voltage $V_{RD1}$ is lower than a reference voltage $V_{REF}$ belonging to the sensing margin SM. Therefore, a memory controller may determine a state of the memory cell as a set state.

FIG. 8B is a graph illustrating a set read voltage distribution 401 and the reset read voltage distribution 410, after a first reading operation is completed. Referring to FIG. 8B, since a resistance of at least a portion of memory cells in a set state is increased by the first reading operation, the set read voltage distribution 401 may move to the right side of the graph. In an exemplary embodiment of the present inventive concept, a read voltage of the memory cell may be increased from the first read voltage $V_{RD1}$ to a second read voltage $V_{RD2}$.

In an exemplary embodiment of the present inventive concept, a memory controller may allow a second reading operation to be performed on memory cells, determined to be in the set state in the first reading operation. The memory cell may be determined to be in a reset state in the second reading operation which the memory controller allows to be performed. In other words, the memory controller may determine that resistance of the memory cell is increased by the first reading operation.

After the second reading operation is completed, the memory controller may input a compensation current to the memory cell determined to be in the reset state in the second reading operation. Referring to FIG. 8C, as a compensation current is input, a read voltage of the memory cell may be decreased from the second read voltage $V_{RD2}$ to the first read voltage $V_{RD1}$. As illustrated in FIG. 8C, the set read voltage distribution 400 may be restored to have a state similar to that prior to the first reading operation by a compensation current. Therefore, the sensing margin SM between memory cells in a set state and memory cells in a reset state may be sufficiently secured.

FIGS. 9A, 9B, 10A, 10B, and 10C are views provided to illustrate an operation of a memory device according to an exemplary embodiment of the present inventive concept.

Figure 9A:
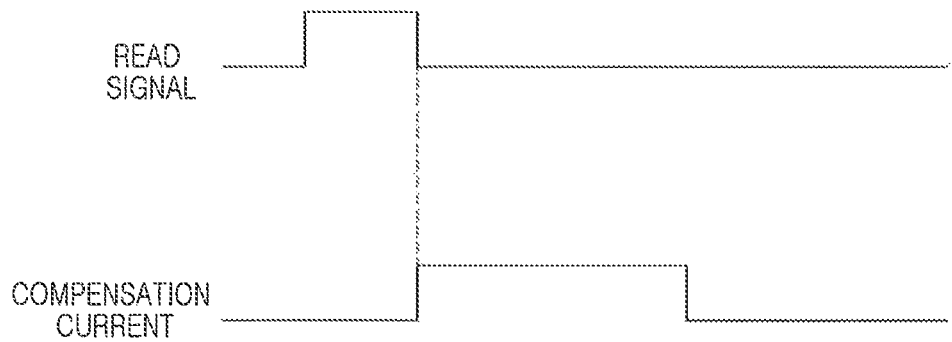
FIGS. 9A, 9B, 10A, 10B, and 10C are views provided to illustrate an operation of a memory device according to an exemplary embodiment of the present inventive concept.
Figure 9B:
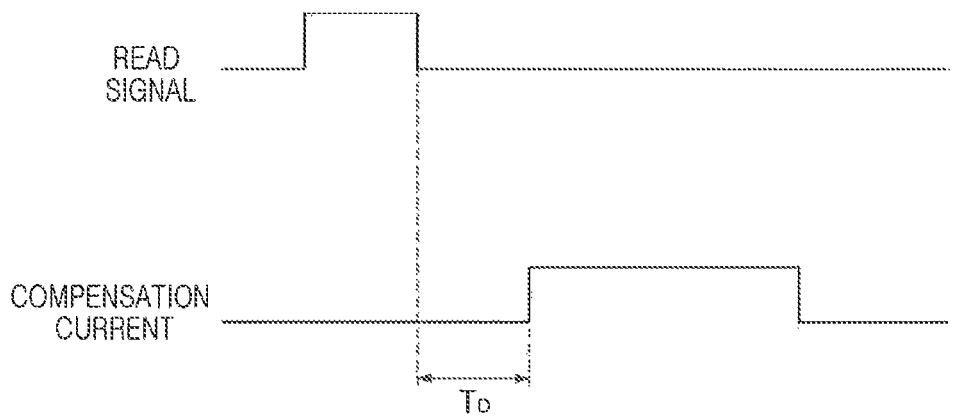

FIGS. 9A and 9B are timing diagrams illustrating a read signal and a compensation current, which a memory controller inputs to memory cells in a reading operation of a memory device, according to an exemplary embodiment of the present inventive concept. In the embodiment illustrated in FIG. 9, a memory controller may sequentially read a first read voltage and a second read voltage from each of the memory cells, while a single reading operation is performed.

First, referring to FIG. 9A, a memory controller may input a read signal to memory cells, and may allow each of a first read voltage and a second read voltage to be sequentially read. In other words, in the embodiment illustrated in FIG. 9A, a first read voltage and a second read voltage may both be detected in a single reading operation. In an exemplary embodiment of the present inventive concept, a reading operation which a memory device allows to be performed may include a precharge section for supplying a current or a voltage to a bit line or a word line, connected to a memory cell, and a development section for measuring a resistance value of a data storage element included in the memory cell using the current or the voltage, supplied in the precharge operation. In an ideal case in which a resistance value of a data storage element is not changed by a reading operation, a read voltage, detected in a memory cell during a development section, may have a constant value.

However, as illustrated previously, when a read voltage is read from a memory cell in a set state, a resistance of a data storage element included in the memory cell in the set state may be increased by a read signal. Thus, during a development section included in a single reading operation, read voltages, detected in a memory cell in a set state, may have different values, in the embodiment illustrated in FIG. 9A, the first read voltage and the second read voltage are sequentially detected during a development section. When the first read voltage and the second read voltage are different from each other, or states of a memory cell, respectively determined by the first read voltage and the second read voltage, are different from each other, a compensation current may be input to the memory cell. In the embodiment illustrated in FIG. 9A, a compensation current may be input immediately after the reading operation is completed.

An operation of the embodiment illustrated in FIG. 9B may be similar to the embodiment illustrated in FIG. 9A. In other words, while a memory controller inputs a read signal to each of the memory cells and a single reading operation is performed, a first read voltage and a second read voltage may be sequentially read. When states of a memory cell, determined by the first read voltage and the second read voltage, are different from each other, the memory controller may input a compensation current to a certain memory cell. In the embodiment illustrated in FIG. 9B, after the reading operation is completed and the predetermined delay time $T_D$ passes, a compensation current may be input to the memory cells.

In the embodiment illustrated in FIG. 9B, a compensation current may be input during the time for which data read from memory cells is output. In an exemplary embodiment of the present inventive concept, the time for which data read from memory cells is output may be similar to the time for which data read from memory cells is written to a page buffer. In the embodiment illustrated in FIG. 9B, after a reading operation, an operation of inputting a compensation current and an operation of outputting data read from memory cells are simultaneously processed. Therefore, the time required for performing the reading operation and outputting the data read from the memory cells may be efficiently managed.

In the embodiments illustrated with reference to FIGS. 9A and 9B, the memory controller may detect the second read voltage only on memory cells determined to be in the set state by the first read voltage. Moreover, the compensation current may only be input to memory cells in different states determined by the first read voltage and the second read voltage. In an exemplary embodiment of the present inventive concept, the memory controller may only input the compensation current to a memory cell, determined to be in the set state by the first read voltage and determined to be in the reset state by the second read voltage. Thus, operation stability of a memory device may be secured, while power consumption thereof may be efficiently managed.

Figure 10A:
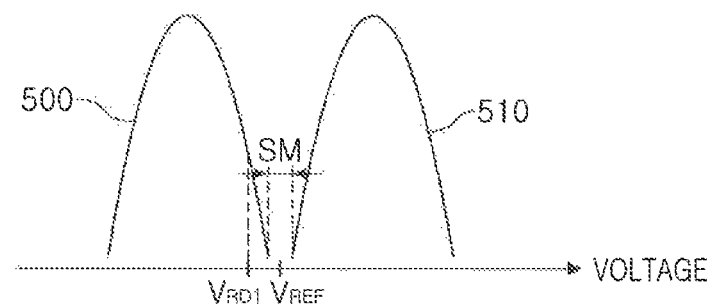
Figure 10B:
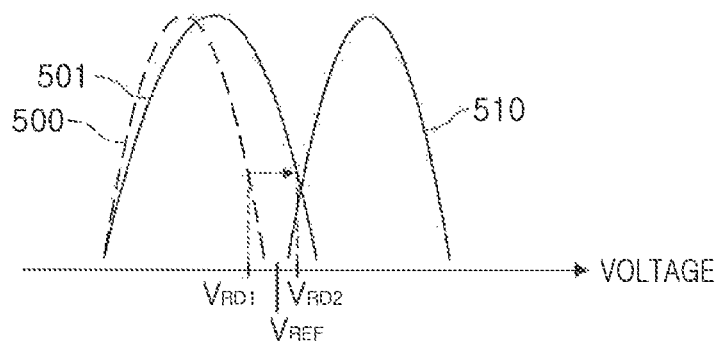
Figure 10C:
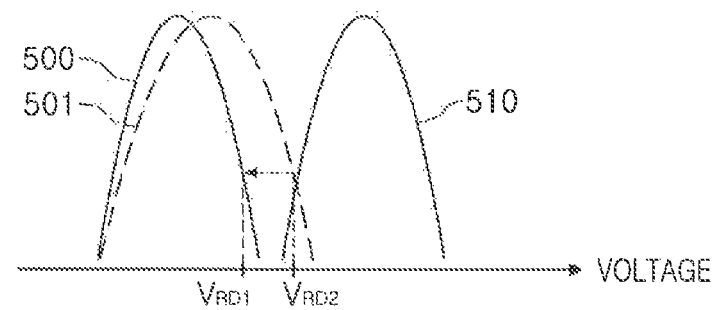

FIGS. 10A, 10B, and 10C are graphs illustrating a distribution of a read voltage depending on a state of memory cells included in a memory device, according to an exemplary embodiment of the present inventive concept. First, FIG. 10A is a graph illustrating a set read voltage distribution 500 and a reset read voltage distribution 510, which memory cells have before a reading operation is performed. Referring to FIG. 10A, a memory controller may read a first read voltage $V_{RD1}$ from a memory cell at a first time point of a development section. The first read voltage $V_{RD1}$ may be lower than a reference voltage $V_{REF}$, and thus, the memory controller may determine a state of the memory cell as a set state.

FIG. 10B is a graph illustrating the set read voltage distribution 501 and the reset read voltage distribution 510, when a phase change occurs in memory cells in a set state by a reading operation. Referring to FIG. 10B, a resistance of at least a portion of memory cells in a set state is increased, thus the set read voltage distribution 501 may move to the right side of the graph. Thus, a read voltage which the memory controller reads from the memory cell at a second time point of the development section may be a second read voltage $V_{RD2}$ higher than the first read voltage $V_{RD1}$.

In an exemplary embodiment of the present inventive concept, the memory controller may detect the second read voltage $V_{RD2}$ from memory cells determined to be in the set state by the first read voltage $V_{RD1}$. Referring to FIG. 10B, at least a portion of the memory cells determined to be in the set state by the first read voltage $V_{RD1}$ may be determined to be in the reset state by the second read voltage $V_{RD2}$.

The memory controller may input a compensation current to the memory cells determined to be in the reset state by the second read voltage $V_{RD2}$. Referring to FIG. 10C, as the compensation current is input, the set read voltage distribution 500 of the memory cells may move to the left side of the graph. In other words, the set read voltage distribution 500 may be restored, by the compensation current, to a state similar to that it was in before the first reading operation. Therefore, a sensing margin SM between memory cells in a set state and memory cells in a reset state may be sufficiently secured.

Figure 11:
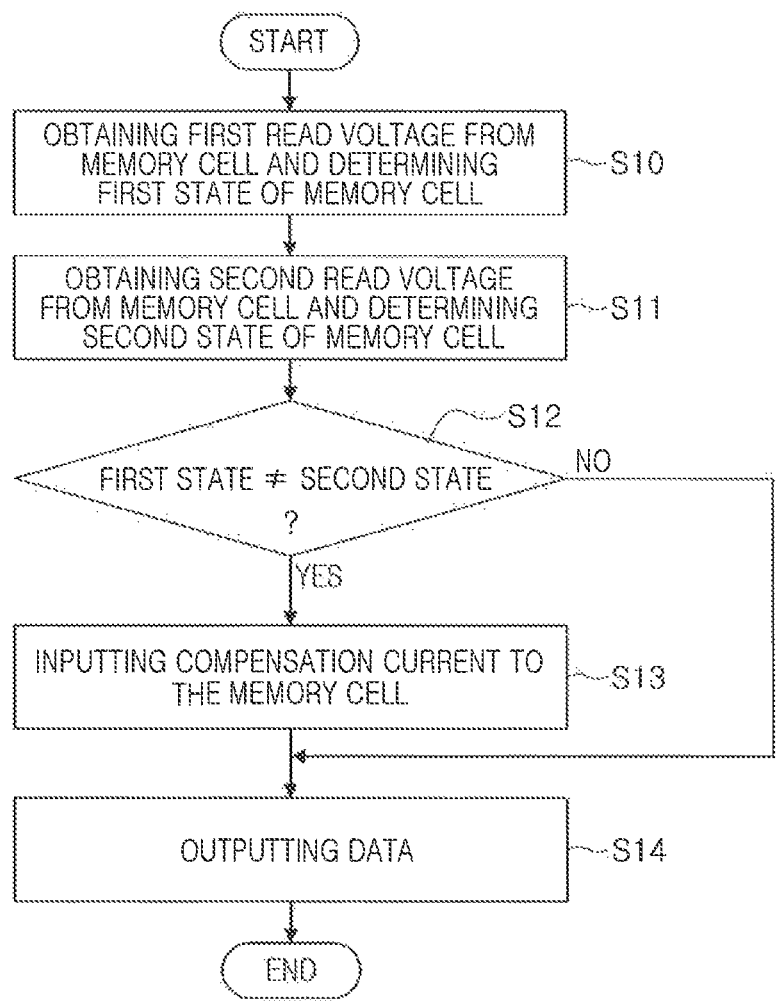
FIGS. 11 and 12 are flow diagrams provided to illustrate an operation of a memory device according to an exemplary embodiment of the present inventive concept.
Figure 12:
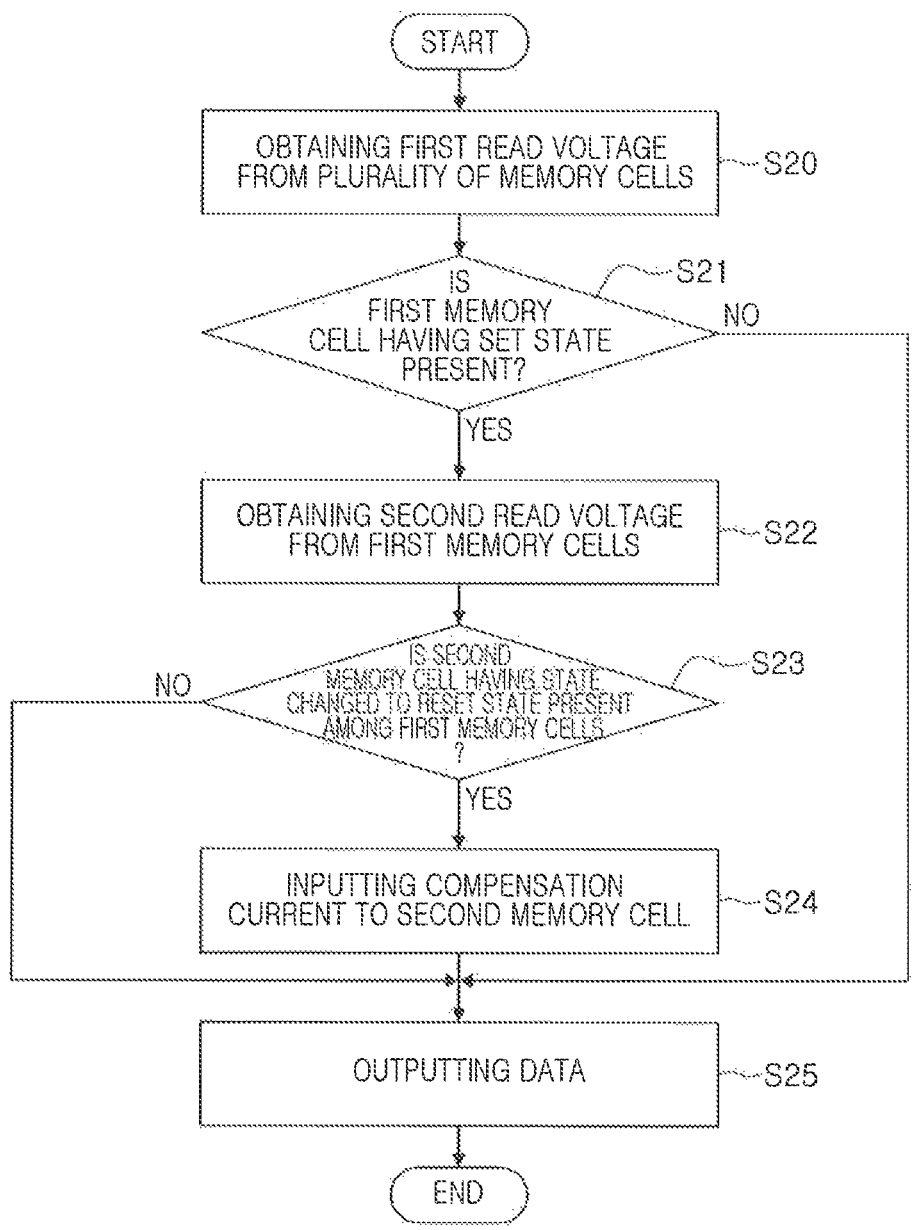

FIGS. 11 and 12 are flow diagrams provided to illustrate an operation of a memory device according to an exemplary embodiment of the present inventive concept.

First, referring to FIG. 11, an operation of a memory device according to an exemplary embodiment of the present inventive concept may begin with a memory controller obtaining a first read voltage from a memory cell and determining a first state of the memory cell (S10). The memory controller may detect a read voltage representing a resistance value of each of memory cells, compare the read voltage to a predetermined reference voltage, and determine whether memory cells have a set state or a reset state according to a comparison result. In S10, the memory controller may determine a first state as a reset state when a first read voltage is higher than a reference voltage, and may determine the first state as a set state when the first read voltage is lower than the reference voltage.

In addition, the memory controller may obtain a second read voltage from the memory cell and may determine a second state of the memory cell (S11). In an exemplary embodiment of the present inventive concept, the memory controller may sequentially detect the first read voltage and the second read voltage. In a manner similar to S10, the memory controller may determine a second state as a reset state when the second read voltage is higher than the reference voltage, and may determine the second state as a set state when the second read voltage is lower than the reference voltage.

The first state and the second state of the memory cell may be determined in different reading operations, or may be determined in a single reading operation. In an exemplary embodiment of the present inventive concept, the memory controller may determine a first state of a memory cell by detecting a first read voltage in a first reading operation, and may determine a second state of the memory cell by detecting a second read voltage in a second reading operation performed after the first reading operation. In addition, the memory controller may detect the first read voltage and second read voltage in a single reading operation.

The memory controller may compare whether the first state and the second state of the memory cell are the same as each other (S12). When the first state and the second state of the memory cell are different from each other as a result of the determination of S12, the memory controller may input a compensation current to the memory cell (S13). When the first state and the second state of the memory cell are different from each other as a result of the determination of S12, the memory controller may determine that a phase change occurred in a data storage element of the memory cell due to a reading operation. The compensation current may be a current used to reverse the phase change that occurred in the data storage element of the memory cell. When the compensation current input is completed, the memory controller may output data read from the memory cell (S14). In addition, when the first state and the second state of the memory cell are the same as each other as a result of the determination of S12, the memory controller may output data without applying a compensation current to the memory cell (S14). In addition, data output by the memory controller in S14 may be determined based on a first read voltage.

Next, referring to FIG. 12, an operation of a memory device according to an exemplary embodiment of the present inventive concept may begin with a memory controller obtaining a first read voltage from a plurality of memory cells (S20). The memory controller compares the first read voltage obtained in S20 to a predetermined reference voltage, and thus, may determine whether first memory cells having a set state are present in the plurality of memory cells (S21). The first memory cells with the set state may have a first read voltage lower than a reference voltage. When first memory cells are not present as a result of the determination of S21, the memory controller may output data read from the plurality of memory cells (S25).

In addition, when first memory cells are present as a result of the determination of S21, the memory controller may obtain a second read voltage from the first memory cells (S22). In other words, the memory controller may obtain a second read voltage only from the first memory cells determined to be in the set state by the first read voltage. Thus, for the memory cells determined to be in a reset state by the first read voltage, a second read voltage is not obtained, and thus, power consumption may be reduced. The first read voltage and the second read voltage may be detected from different reading operations, or may be sequentially detected from a single reading operation.

The memory controller may compare the second read voltage to the reference voltage, and thus, may determine whether second memory cells are present among the first memory cells (S23). In S23, the second memory cells may be memory cells whose state was changed to the reset state. In an exemplary embodiment of the present inventive concept, the memory controller may determine that a portion of the memory cells, among the first memory cells, which has the second read voltage higher than the reference voltage, to be the second memory cells.

When the second memory cells are not present as a result of the determination of S23, the memory controller may output data read from the memory cells (S25). In addition, when the second memory cells are present as a result of the determination of S23, the memory controller may input a compensation current to second memory cells (S24). The compensation current may be a current for reversing a phase change occurring in a data storage element of the second memory cells by a reading operation. When the compensation current input is completed, the memory controller may output data read from the second memory cells (S25). Data output from the memory controller in S25 may be determined based on the first read voltage.

Figure 13:
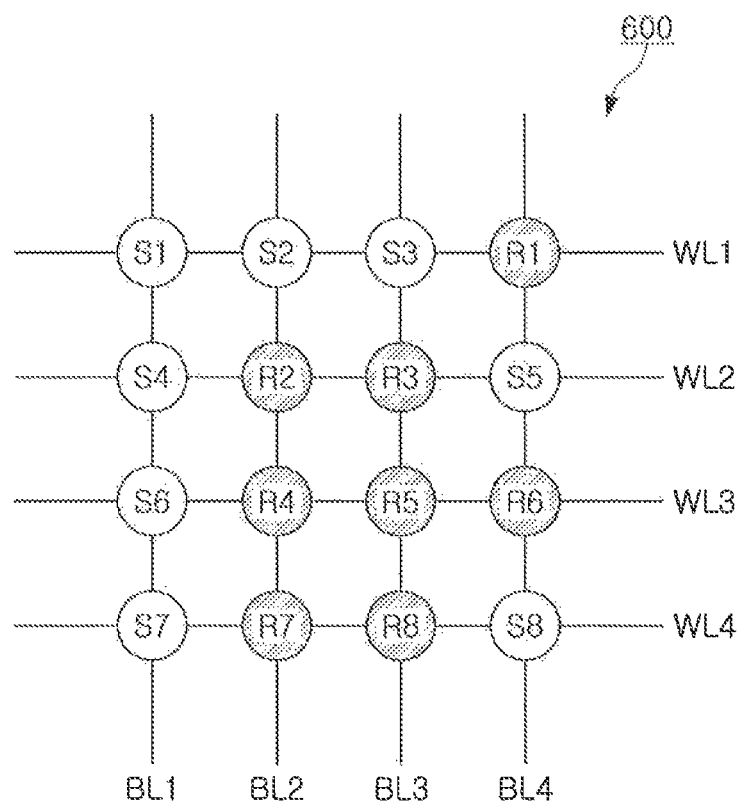
FIGS. 13, 14 and 15 are views provided to illustrate a method of compensating for a change in resistance of a memory cell, occurring in a reading operation of a memory device according to an exemplary embodiment of the present inventive concept.
Figure 14:
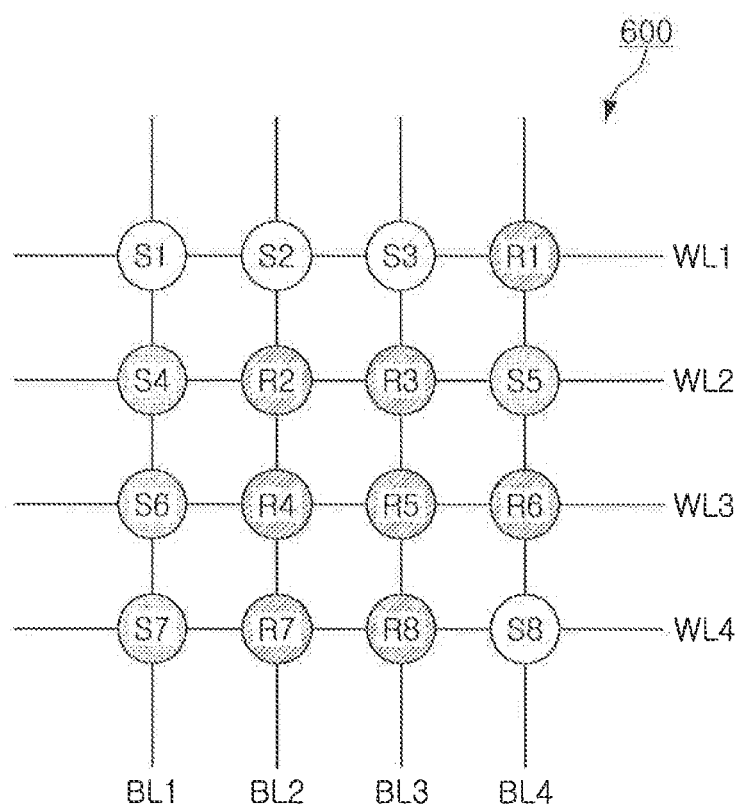
Figure 15:
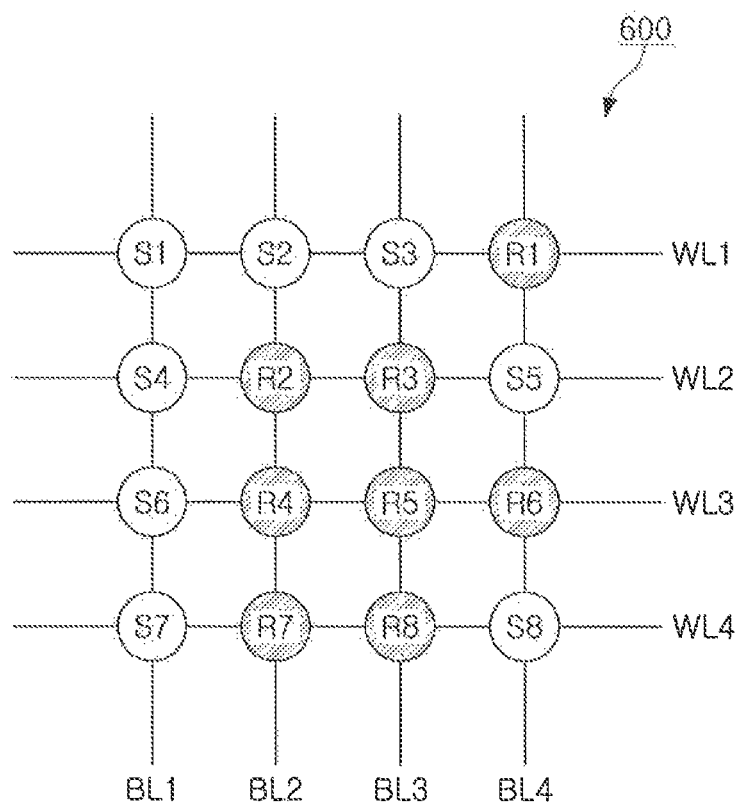

FIGS. 13, 14 and 15 are views provided to illustrate a method of compensating for a change in resistance of a memory cell, which may occur in a reading operation of a memory device according to an exemplary embodiment of the present inventive concept.

In the embodiment illustrated in FIGS. 13 through 15, a memory device 600 may include 16 memory cells S1 to S8 and R1 to R8, disposed at points where four word lines WL1 to WL4 and four bit lines BL1 to BL4 intersect. However, the number of the word lines to WL1 to WL4 and the bit lines BL1 to BL4 as well as the number of the memory cells S1 to S8 and R1 to R8 are only for convenience of explanation and may be variously modified.

Referring to FIG. 13, each of the memory cells S1 to S8 and R1 to R8 may have one state of a set state and a reset state. The memory controller may input a predetermined read signal to each of the memory cells S1 to S8 and R1 to R8, and may detect a first read voltage from each of the memory cells S1 to S8 and R1 to R8. The memory controller may compare the first read voltage to a predetermined reference voltage, and may determine a state of each of the memory cells S1 to S8 and R1 to R8. In an exemplary embodiment of the present inventive concept, a state of each of the memory cells S1 to S8 and R1 to R8 may be determined to be in a reset state when the first read voltage is higher than the reference voltage, and may be determined to be in a set state when the first read voltage is lower than the reference voltage.

Of the memory cells S1 to S8 and R1 to R8, the memory controller may select the memory cells S1 to S8, which were determined to be in a set state, as the first memory cells. Referring to FIG. 14, in a reading operation in which a first read voltage is read, from at least a portion of the first memory cells S1 to S8 in a set state, a phase change may occur and a resistance value may be increased. Among the first memory cells S1 to S8, the portion of memory cells, which has the phase change due to the reading operation, may be referred to as second memory cells S4 to S7.

To find the second memory cells S4 to S7, the memory controller may read a second read voltage from the first memory cells S1 to S8. The second read voltage may be detected in a reading operation such as a first read voltage, or may be detected in a reading operation separate from the first read voltage. The second read voltage detected from the second memory cells S4 to S7 may have a value relatively higher than a second read voltage detected from the other first memory cells S1 to S3 and S8. This is so, because a phase change occurred in a data storage element of the second memory cells S4 to S7 when reading the first read voltage.

Referring to FIG. 15, the memory controller may input a compensation current to the second memory cells S4 to S7. Due to the compensation current, the phase of the data storage element of each of the second memory cells S4 to S7 may be restored to where it was prior to the change, and thus, a resistance value thereof may be decreased. Thus, as illustrated in 15, a state of the memory cells S1 to S8 and R1 to R8 after the reading operation is completed may be the same as a state of the memory cells S1 to S8 and R1 to R8 before the reading operation.

Figure 16:
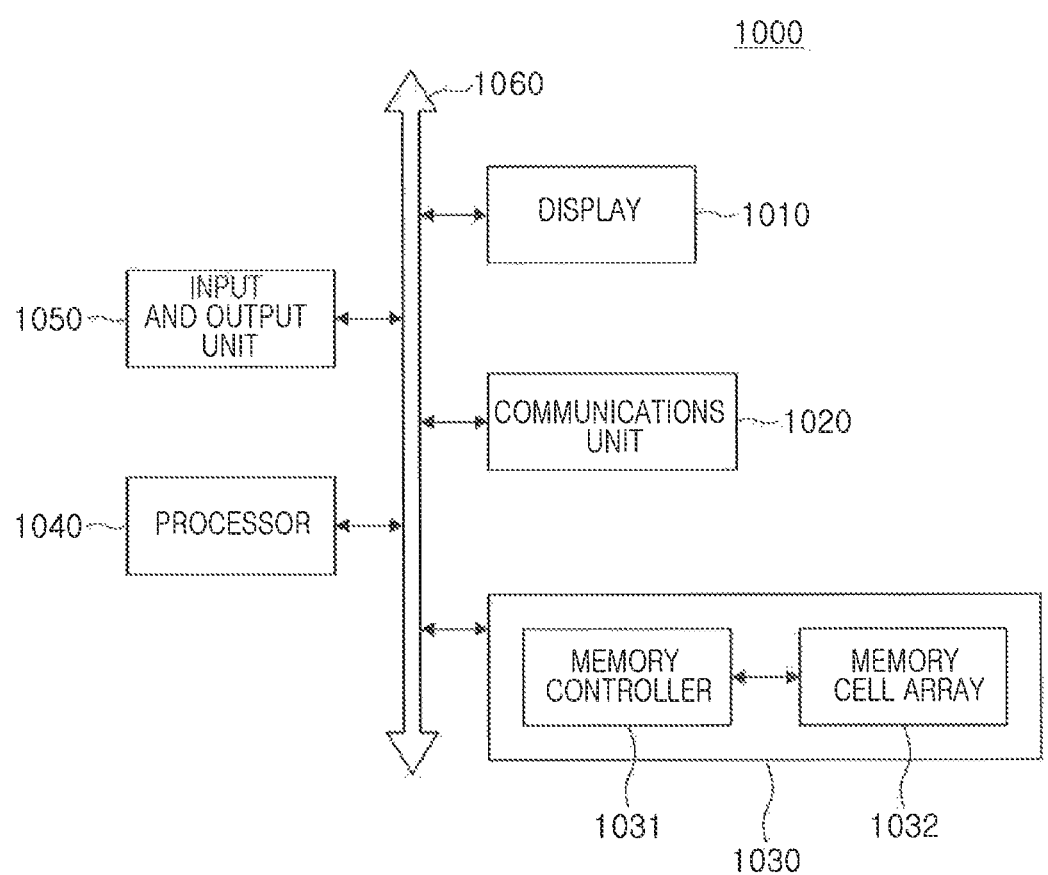
FIG. 16 is a block diagram illustrating an electronic device of a memory device according to an exemplary embodiment of the present inventive concept.

FIG. 16 is a block diagram illustrating an electronic device including a memory device according to an exemplary embodiment of the present inventive concept.

An electronic device 1000 according to the embodiment illustrated in FIG. 16 may include a display 1010, a communications unit 1020, a memory device 1030, a processor 1040, an input and output unit 1050, and the like. Components such as the display 1010, the communications unit 1020, the memory device 1030, the processor 1040, the input and output unit 1050, and the like may communicate with each other through a bus 1060. In addition, the electronic device 1000 may further include a power supply device, a port, or the like.

The processor 1040 may perform a specific operation, a command, a task, and the like. The processor 1040 may be a central processing unit (CPU), a microprocessor unit (MCU), application processor (AP), or the like, and may communicate with other components such as the display 1010, the communications unit 1020, the memory device 1030, and the like, through the bus 1060.

The memory device 1030 included in the electronic device 1000 illustrated in FIG. 16 may be a memory device according to various exemplary embodiments of the present inventive concept. For example, the memory device 1030 may include a memory controller 1031 and a memory cell array 1032, and may be operated according to the various embodiments illustrated with reference to FIGS. 1 through 15. The memory device 1030 may store, output, and delete data in response to a command transmitted by the processor 1040.

As set forth above, according to exemplary embodiments of the present inventive concept, a compensation current for offsetting a change in resistance which may occur in a memory cell by a reading operation may be selectively input only to a memory cell in which the resistance change occurs. Thus, a sensing margin can be secured by effectively compensating for a change in resistance of a data storage element occurring during a reading operation, thereby improving operating characteristics of a memory device.

While the present inventive concept has been described with reference to exemplary embodiments thereof, it will be apparent to those skilled in the art that modifications and variations could be made thereto without departing from the scope of the present inventive concept, as defined by the appended claims.

What is claimed is:

1. A memory device, comprising:
   a memory cell array, including a memory cell having a switch element and a data storage element connected to the switch element, wherein the data storage element has a phase change material; and
   a memory controller for inputting a first read current to the memory cell to detect a first read voltage, inputting a second read current to the memory cell to detect a second read voltage, and inputting a compensation current to the memory cell after detecting the second read voltage, wherein the compensation current lowers a resistance value of the data storage element, the compensation current is input when a first state of the memory cell is different from a second state of the memory cell, the first state is determined using the first read voltage and the second state is determined using the second read voltage.

2. The memory device of claim 1, wherein the memory controller inputs the compensation current to the memory cell, when the first state is a set state and the second state is a reset state.

3. The memory device of claim 2, wherein the memory controller determines a third state of the memory cell as the set state.

4. The memory device of claim 1, wherein the memory controller inputs the compensation current to the memory cell, when the inputting of the second read current is completed.

5. The memory device of claim 1, wherein the memory controller inputs the compensation current to the memory cell, while data written in the memory cell is being stored in a page buffer.

6. The memory device of claim 1, wherein the memory controller adjusts a magnitude of the compensation current or an input time of the compensation current, based on a difference between the first read voltage and the second read voltage.

7. The memory device of claim 6, wherein the input time of the compensation current is longer than an input time of the first read current or the second read current.

8. The memory device of claim 1, wherein the memory controller inputs the compensation current to the memory cell, when the first state is the same as the second state and a difference between the second read voltage and the first read voltage is greater than a reference value.

9. The memory device of claim 1, wherein the first input current and the second input current are the same as each other.

10. The memory device of claim 1, wherein the switch element comprises an ovonic threshold switch (OTS) device.

11. The memory device of claim 1, wherein the first input current flows to the data storage element from the switch element in the memory cell.

12. A memory device, comprising:
a memory cell array, including a memory cell having a switch element and a data storage element connected to the switch element, wherein the data storage element has a phase change material; and
a memory controller for inputting a read current to the memory cell to sequentially detect a first read voltage and a second read voltage during a single read operation, and inputting a compensation current to the memory cell, wherein the compensation current is input when the memory cell is determined to be in a set state based on the first read voltage and the memory cell is determined to be in a reset state based on the second read voltage such that the compensation current puts the memory cell back into the set state after the memory cell is in the reset state.

13. The memory device of claim 12, wherein the memory controller inputs the compensation current to the memory cell to lower a resistance value of the data storage element.

14. The memory device of claim 12, wherein the memory controller inputs the compensation current to the memory cell, when the inputting of the read current is completed.

15. The memory device of claim 12, wherein the memory controller inputs the compensation current to the memory cell while data written in the memory cell is being stored in a page buffer.

16. The memory device of claim 12, wherein the read current causes a phase change in the data storage element, and increases a resistance value of the data storage element.

17. A memory device, comprising:
a memory cell array having a plurality of memory cells in a set state or a reset state; and
a memory controller for selecting, from the plurality of memory cells, first memory cells in the set state, selecting, from the first memory cells, second memory cells switched to the reset state, and inputting a compensation current to the second memory cells, wherein the compensation current changes the second memory cells to the set state, while a reading operation on the memory cell array is performed.

18. The memory device of claim 17, wherein, the memory controller inputs a first read current to the plurality of memory cells to select the first memory cells, and inputs a second read current to the first memory cells to select the second memory cells, while the reading operation is performed.

19. The memory device of claim 17, wherein the memory controller sequentially performs a first sensing for selecting the first memory cells and a second sensing for selecting the second memory cells while a read current is input to the plurality of memory cells.

20. The memory device of claim 19, wherein the memory controller sequentially performs the first sensing and the second sensing during a development section of the read current.

* * * * *